United States Patent

[11] 3,564,288

[72] Inventor Douglas M. Bauer
Danvers, Mass.

[21] Appl. No. 739,070
[22] Filed June 21, 1968
[45] Patented Feb. 16, 1971
[73] Assignee General Electric Company
a corporation of New York

[54] INHERENTLY BALANCED CHOPPER CIRCUIT
9 Claims, 3 Drawing Figs.

[52] U.S. Cl. .................... 307/240; 307/251
[51] Int. Cl. .................... H03k 17/56
[50] Field of Search .................... 307/251, 253, 240, 301

[56] References Cited

UNITED STATES PATENTS

| | | | |
|---|---|---|---|
| 3,018,391 | 1/1962 | Lindsay et al. | 307/251X |
| 3,339,087 | 8/1967 | Forbes | 307/240 |
| 3,401,359 | 9/1968 | Becker | 307/240X |
| 3,408,511 | 10/1968 | Bergersen et al. | 307/304X |
| 3,469,173 | 9/1969 | Ohashi et al. | 307/251X |

*Primary Examiner*—John S. Heyman
*Attorneys*—Richard E. Hosley, Frank L. Neuhauser, Oscar B. Waddell and Melvin M. Goldenberg

ABSTRACT: An inherently balanced, thermally stable signal chopper circuit. A field effect transistor connected across a variable signal source is driven by a chopper drive circuit. The chopped signal is applied to a differential amplifier. Grounding the substrate balances and minimizes interelectrode capacitances to minimize chopper drive signals at the differential amplifier output.

PATENTED FEB 16 1971 3,564,288

INVENTOR
DOUGLAS M. BAUER

BY Richard E. Hosley

ATTORNEY

INHERENTLY BALANCED CHOPPER CIRCUIT

BACKGROUND OF THE INVENTION

This invention generally relates to solid-state signal conversion means and more specifically to a chopper circuit for converting a variable input signal to an amplitude modulated alternating signal.

In the prior art, chopper circuits utilizing solid-state switching means have required the addition of certain discrete components to compensate for unequal forward capacitances in the solid-state device. Without such compensation, an offset voltage was produced in the output signal from the chopper circuit which decreased the overall sensitivity of any equipment utilizing the chopper circuit. In addition to adding costs to the overall chopper circuit, these discrete components have produced thermal instability and have made balancing difficult.

Therefore, it is an object of this invention to provide a solid-state chopper circuit which is especially adapted for use with input signals having low values.

Another object of this invention is to provide a solid-state chopper circuit which is inherently balanced.

Another object of this invention is to provide a solid-state chopper circuit which exhibits improved thermal stability.

Still another object of this invention is to provide a chopper circuit having a reduced number of discrete components an and reduced costs.

SUMMARY

In accordance with one aspect of this invention, an input signal is impressed across a field effect transistor while a driving signal is applied to another electrode. If the signals are controlled to prevent effective current conduction internally between the substrate and the electrodes connected to the signal source and if the substrate is grounded, an inherently balanced chopper circuit results.

The This invention is pointed out with particularity in the appended claims. A more thorough understanding of the above and further objects and advantages of this invention may be attained by referring to the following description taken in conjunction with the accompanying drawings.

DESCRIPTION OF ILLUSTRATIVE EMBODIMENTS

Figure 1:
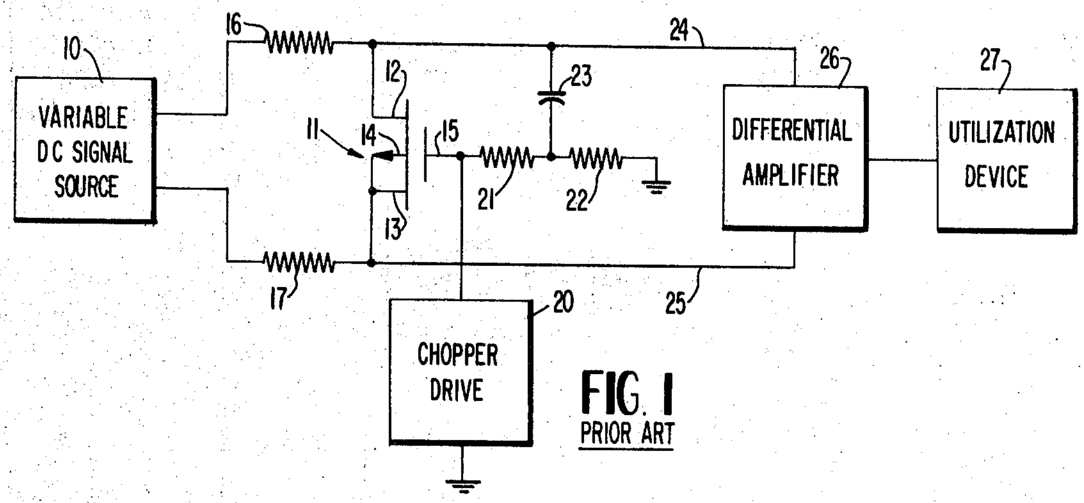
FIG. 1 PRIOR ART
FIG. 1 illustrates a chopper circuit constructed in accordance with the prior art.

In the following discussion, like numerals refer to like elements throughout. In accordance with prior art techniques, input signals were applied to amplifiers after they were modified by a chopper circuit. In the specific example shown in FIG. 1, a variable direct current signal source 10 is coupled to a field effect transistor 11 having a drain electrode 12, a source electrode 13, a substrate electrode 14 and a gate electrode 15. One output terminal of the variable direct current signal source 10 is coupled to the drain electrode 12 by a resistor 16. A resistor 17 couples the other direct current signal source terminal to the source electrode 13. In accordance with conventional techniques, the substrate electrode 14 was connected to the source electrode 13.

A chopper drive circuit 20 was connected between ground and the gate electrode 15 and usually energized the field effect transistor 11 with a square wave. Chopper drive signal feedthrough from the gate electrode 15 to the drain and source electrodes 12 and 13 was balanced by the addition of a voltage divider circuit including resistors 21 and 22 connecting the gate electrode 15 to ground. A capacitor 23 coupled the common junction of the voltage divider circuit to the drain electrode 12. When these components were properly selected, equal amplitude, in-phase chopper drive components appeared on output conductors 24 and 25 which coupled the signals to a differential amplifier 26. Therefore, an output signal to a utilization device 27 did not include substantial traces of the chopper drive signal for predetermined operating conditions. However, temperature changes could cause an imbalance in the system and the addition of these discrete components added to the overall circuit cost.

Figure 2:
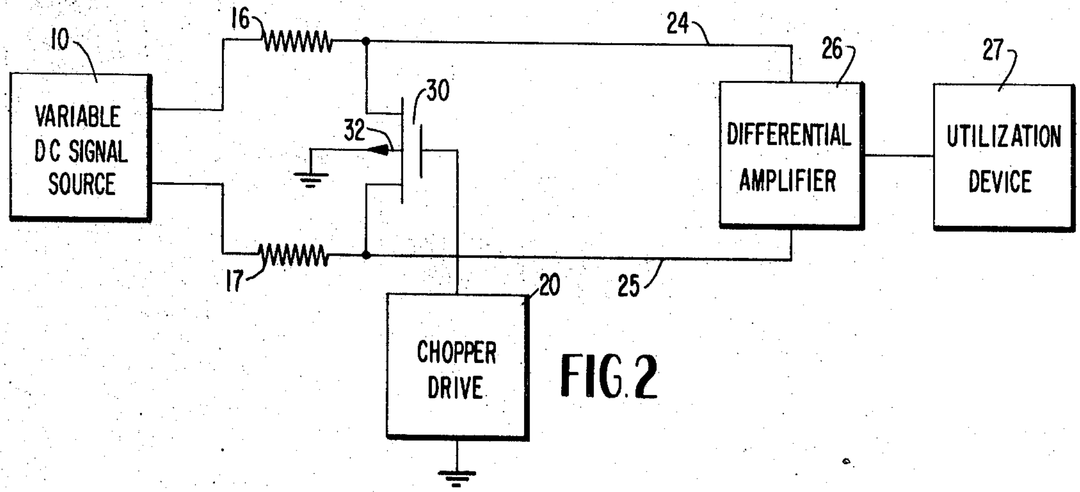
FIG. 2 illustrates one embodiment of this invention.

In accordance with this invention, the resistors 21 and 22 and the capacitor 23 are eliminated. In FIG. 2, a "P" channel field effect transistor 30 serves as a chopper element while an "N" channel field effect transistor 31 acts as a chopper in FIG. 3. In both cases, the substrate electrodes are grounded, the substrate being designated by numerals 32 and 33 in FIGS. 2 and 3 respectively. Except for variations which occur when the relative polarities of the applied signals are altered, the operation of the two circuits is identical. Further, the polarity of the direct current input signal for magnitudes normally encountered when operating such a device is not critical. If the direct current signal biases field effect transistors so that the source-to-substrate and drain-to-substrate junctions are reversed biased with respect to ground, the incoming signal may be of any magnitude below the reverse bread breakdown voltage. If the junctions tend to be forward biased, the input signal must be maintained so insignificant currents traverse the junctions.

When these conditions are attained and maintained in chopper circuits using field effect transistors, and especially metal-oxide-silicon field effect transistors (MOSFET's) feedthrough signals are substantially eliminated. Any parasitic capacitances which might remain are small and very nearly equal over normally encountered thermal conditions. Therefore, chopper drive signals which do leak through to the conductors 24 and 25 are readily eliminated in the differential amplifier 26.

As a specific example of a chopper circuit constructed in accordance with this invention, the following values may be used in accordance with the schematic illustrated in FIG. 2.

| ELEMENT | VALUE |
|---|---|
| Variable d.c. source **10** | 0—50 MVDC |
| Resistors **16** and **17** | 1,000 Ohms |
| ELEMENT | VALUE |
| Chopper Drive Circuit **20** | 10 volt 400 Hertz, sine wave |
| Field Effect Transistor **31** | 2N4351 (Motorola) |
| Differential Amplifier **26** | A702A integrated circuit amplifier coupled to the field effect transistor by 0.33 $\mu$ fd capacitors. |

Figure 3:
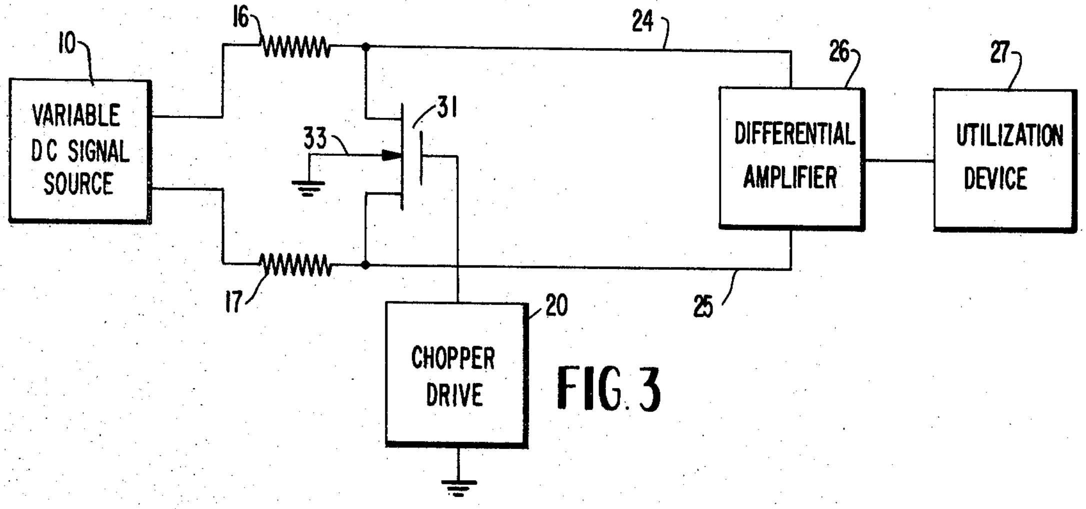
FIG. 3 illustrates another embodiment of this invention.

When this circuit is constructed in accordance with the general principles described herein and specifically in accordance with the schematic shown in FIG. 3, it has been found that the chopper drive signal is attenuated by approximately 120 db. Furthermore, even with the 10 volt chopper drive signal normally applied, the circuit is capable of producing an output from the differential amplifier which is sensitive to a 20 $\mu$ v. input signal from the signal source 10.

By eliminating the requirement for discrete components, the cost of the chopper circuit is reduced. Further, inherent balancing of the circuit is attained. Finally, the elimination of the discrete components improves the thermal stability of the chopper circuit because matched thermal characteristics, which were difficult to obtain in the prior art devices, are attainable.

It will be obvious that many modifications may be made to the circuit without departing from the true spirit and scope of the invention. While the circuit has been shown specifically as chopping a variable direct current signal, other sources may also be used including alternating current sources where chopping of such a signal is desirable. Further, while a MOSFET has been specifically discussed, this invention is applicable to other circuits utilizing similar devices. Although a sine wave has been designated as the chopper drive signal, this invention can be applied to other chopper circuits utilizing different driving signals and improvements in the output signals will be realized. Different coupling networks may be used to couple the chopped signal to the input of the differential amplifier for obtaining better impedance matching or to effect isolation without departing from the invention. Therefore, while the invention has been discussed with reference to specific embodiments, it will be obvious to those of ordinary skill in the art that many modifications may be made to the circuit. It is an object of the appended claims to cover all such changes and modifications as may come within the true spirit and scope of the invention.

I claim:

1. In a circuit for converting a variable amplitude input signal to a variable alternating current output signal (having a variable level for a utilization device) by chopping the input signals in response to signals from a driving source, the improvement of means for effecting the conversion by minimizing or eliminating feedthrough of the driving signal components from the output comprising:

a. a field effect transistor having gate, source, drain and substrate electrodes,
b. means for connecting said gate electrode to the driving source to impress driving signals on the gate electrode;
c. means for connecting the drain and source electrodes to the input signal source and a utilization device;
d. means for impressing an input signal from said source on said drain and source electrodes of a polarity and magnitude so as to prevent any substantial forward current conduction at either the substrate-drain or substrate-source junctions; and
e. means for directly grounding the substrate electrode to eliminate the feedthrough of said driving signals through the substrate-gate capacitance.

2. A signal conversion circuit as recited in claim 1 wherein said field effect transistor is taken from the group consisting of "P" and "N" channel field effect transistors and the input signal has a relative magnitude and polarity relative to ground which causes the substrate drain and substrate source junctions to be forward biased, the signal magnitude being limited to prevent substantial conduction through said junctions.

3. A signal conversion circuit as recited in claim 1 wherein said field effect transistor is taken from the group consisting of "P" and "N" channel field effect transistors and the input signal has a relative magnitude and polarity relative to ground which causes the substrate drain and substrate source junctions to be reversed biased.

4. A signal conversion circuit as recited in claim 1 wherein said grounding means directly grounds said substrate electrode.

5. A circuit for converting a signal from a variable amplitude source to an amplitude modulated alternating current signal comprising:

a. means adapted for connection to a signal source for coupling a differential signal therefrom;
b. a metal oxide-silicon field effect transistor with gate, drain, source and substrate electrodes, said drain and source electrodes being connected to said signal source coupling means and said substrate electrode being directly grounded to thereby maintain it at ground potential and prevent feedthrough of drive signals through the gate-substrate capacitance;
c. a high input impedance differential amplifier having a pair of input terminals;
d. means connecting said differential amplifier input terminals to said drain and source electrodes,
e. means connected to said gate electrode for applying a drive signal thereto, the said input signal having a magnitude and polarity which prevents substantial forward current conduction through the substrate-drain and substrate-source junctions, the drive signal causing intermittent conduction between said drain and said source electrodes whereby said input signal is chopped and a differential alternating current input is applied to said differential means; and
f. the input signal utilization means connected to be energized by a signal from said differential amplifier means which is substantially void of the signal from said driving means.

6. A signal conversion circuit as recited in claim 5 wherein said signal source coupling means comprises a pair of resistors, one of said resistors being connected to said drain electrode and the other of said resistors being connected to said source electrode to be in series between said electrodes and the signal source.

7. A signal conversion circuit as recited in claim 6 wherein said field effect transistor is taken from the group consisting of "P" and "N" channel enhancement mode field effect transistors and the input signal has a relative magnitude and polarity relative to ground which causes the substrate-drain and substrate-source junctions to be forward biases, the input signal being limited to prevent substantial conduction through said junctions.

8. A signal conversion circuit as recited in claim 6 wherein said field effect transistor is taken from the group consisting of "P" and "N" channel enhancement mode field effect transistors and the input signal has a relative magnitude and polarity relative to ground which causes the substrate-drain and substrate-source junctions to be reverse biased.

9. A signal conversion means as recited in claim 6 wherein said drive signal means applied applies a sinusoidal input voltage to said gate electrode.